(12) United States Patent
Matsumoto

(10) Patent No.: US 7,723,848 B2
(45) Date of Patent: May 25, 2010

(54) SEMICONDUCTOR DEVICE AND METHOD FOR DESIGNING SAME

(75) Inventor: Hiroki Matsumoto, Kanagawa (JP)

(73) Assignee: NEC Electronics Corporation, Kanagawa (JP)

( * ) Notice: Subject to any disclaimer, the term of this patent is extended or adjusted under 35 U.S.C. 154(b) by 732 days.

(21) Appl. No.: 11/522,436

(22) Filed: Sep. 18, 2006

(65) Prior Publication Data

US 2007/0063350 A1    Mar. 22, 2007

(30) Foreign Application Priority Data

Sep. 20, 2005    (JP) .............................. 2005-271673

(51) Int. Cl.
*H01L 23/48* (2006.01)
(52) U.S. Cl. ................ 257/758; 257/774; 257/E23.145
(58) Field of Classification Search ................ 257/211, 257/758, 759, 760, 774, E23.145
See application file for complete search history.

(56) References Cited

U.S. PATENT DOCUMENTS 6,483,176 B2 *  11/2002  Noguchi et al. ............. 257/666
2001/0000928 A1 *  5/2001  Lee et al. ..................... 257/786

FOREIGN PATENT DOCUMENTS

| CN | 1664997 A | 9/2005 |
|---|---|---|
| JP | 03-034353 A | 2/1991 |
| JP | 5-243321 | 9/1993 |
| JP | 2970232 B | 8/1999 |
| WO | 2005/083767 A1 | 9/2005 |

* cited by examiner

*Primary Examiner*—Thanhha Pham
(74) *Attorney, Agent, or Firm*—Sughrue Mion, PLLC

(57) ABSTRACT

A silica residue is generated, due to a presence of a step formed by a presence of the first layer metallic interconnect, and then, the residual silica is etched to form hollow portions when vias for the metallic interconnect provided in a layer above thereof is formed, and further, insulating materials remained above the hollow portions flakes off to create contaminants, leading to a reduction in the production yield. In the present invention, interconnects provided in a layer underlying a via group, which are provided for coupling to the upper layer interconnect layer, are disposed so as to cover vias composing its via group.

5 Claims, 6 Drawing Sheets

SEMICONDUCTOR DEVICE AND METHOD FOR DESIGNING SAME

This application is based on Japanese patent application No. 2005-271,673, the content of which is incorporated hereinto by reference.

BACKGROUND

1. Field of The Invention

The present invention relates to a semiconductor device and a method for designing the semiconductor device, and, in particular, relates to a semiconductor device provided by employing a planarization with silica for an interlayer film and a method for designing the semiconductor device.

2. Related Art

In recent circumstances in modern semiconductor devices, number of layers required for composing an interconnect structure is more and more increased for achieving higher density of elements with lower production cost, and new technologies and new materials are proposed for achieving an improved multiple-layered interconnect. Among these new technologies, a typical technology is to achieve a planarization of an interlayer insulating film by employing a silica film produced via a rotation coating process (hereinafter referred simply as "silica"). In this technology, an interlayer insulating film such as a plasma oxidization film is deposited, and then, the film is coated with silica to fill depressions created between the interconnects with silica, thereby reducing the unevenness in the surface to provide a flat interlayer film.

In addition to above, a method for planarizing a multiple-layered metallic pad on a semiconductor device is described in Japanese Patent No. 2,970,232.

The present inventors have conducted relevant experiments, and have found the following problems.

FIG. 5 is a schematic plan view of a semiconductor device experimentally produced in the experiment.

A semiconductor device shown in FIG. 5 is formed by providing a second layer metallic interconnect 12 on a first layer metallic interconnect 11, and providing via hole group 13 for coupling to a third layer metallic interconnect on an insulating film that is provided on the second layer metallic interconnect 12. As shown in FIG. 5, ends of the first layer metallic interconnect 11 are provided to overlap with the via hole group 13.

A process for manufacturing the above-described semiconductor device will be described in reference to FIGS. 6A and 6B.

A first layer metallic interconnect 11, an insulating film 22 and a second layer metallic interconnect 12 are formed on an insulating film 21. Next, a deposition of a plasma oxide film is conducted to form an interlayer insulating film 23. Next, a silica coating operation (silica coating+baking+etchback) is conducted to planarize the interlayer film 23. Deposition of a plasma oxide film is conducted again to form an insulating film 25. (FIG. 6A). Subsequently, in order to form via holes for coupling to the third layer metallic interconnect, a resist is patterned, and a wet etch process is conducted, and subsequently, a dry etch process is conducted to form via holes 13 (FIG. 6B).

While a surplus silica remained on the surface is removed via an etchback process in this occasion, a silica residue 24 remained during the silica coating process is generated, due to a presence of a step, which is created due to a presence of the first layer metallic interconnect 11. Silica remained in the step is also simultaneously etched via a wet etch process for forming vias that provides an electrical coupling between the second layer metallic interconnect and the third layer metallic interconnect, and thus hollow portions are generated. Then, insulating materials remained above these hollow portions flake off to create contaminants, leading to a reduction in the production yield.

SUMMARY OF THE INVENTION

In the present invention, interconnects provided in a layer underlying a via group, which are provided for coupling to the upper layer interconnect layer, are disposed so as to cover all vias composing its via group.

In particular, the present invention involves arranging interconnects disposed in a layer underlying a region including cluster of vias, which forms a large-scale meshed pattern for coupling the upper layer interconnect layer, to form a pattern that covers the entire vias in its via group.

As described above, since a generation of a step due to an underlying interconnect under the group of vias for coupling to the upper layer interconnect, which has been found in the conventional structure, is prevented according to the present invention, an abnormal etching of a silica residue can be prevented.

BRIEF DESCRIPTION OF THE DRAWINGS

The above and other objects, advantages and features of the present invention will be more apparent from the following description taken in conjunction with the accompanying drawings, in which.

DETAILED DESCRIPTION OF THE PREFERRED EMBODIMENTS

The invention will be now described herein with reference to illustrative embodiments. Those skilled in the art will recognize that many alternative embodiments can be accomplished using the teachings of the present invention and that the invention is not limited to the embodiments illustrated for explanatory purposed.

In order to further clarify objects, characteristics and advantageous effects of the present invention, embodiments illustrating the present invention will be described hereinafter in detail, in reference to the annexed figures.

Figure 1A:
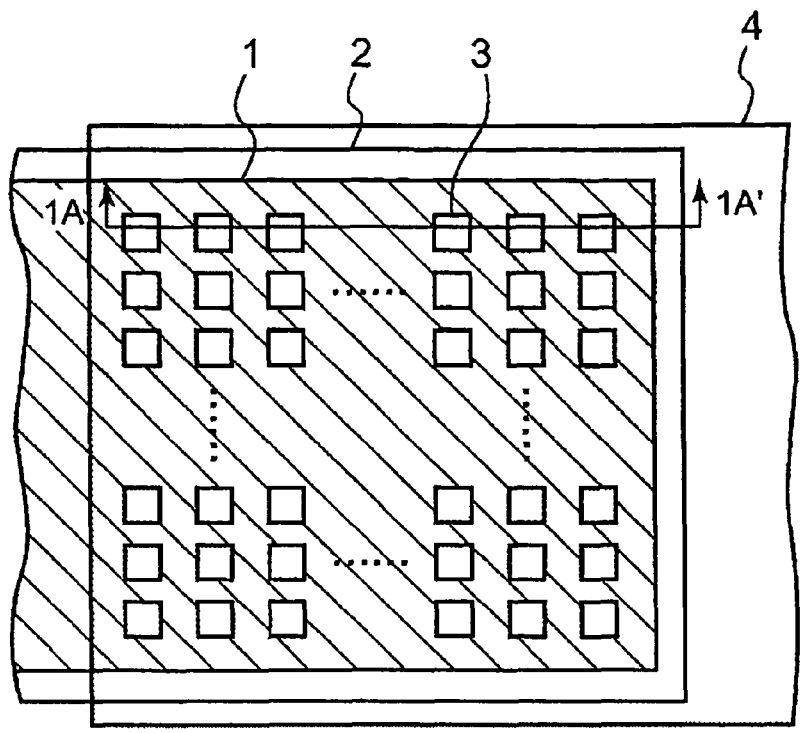
FIG. 1A is a plan view of a semiconductor device of first embodiment according to the present invention.
Figure 1B:
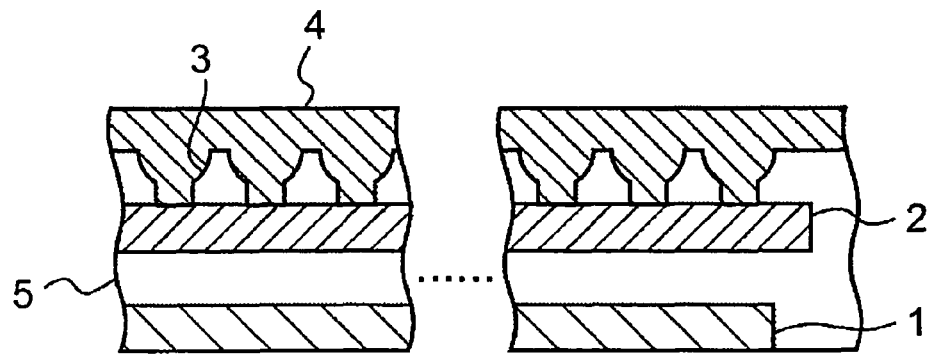
FIG. 1B is a cross-sectional view along line 1A-1A' appeared in FIG. 1A.

FIG. 1A is a plan view of a semiconductor device according to first embodiment of the present invention, and FIG. 1B is a cross-sectional view along line 1A-1A' appeared in FIG. 1A.

A first layer metallic interconnect 1 is provided on a semiconductor substrate (not shown), and a second layer metallic interconnect 2 is provided on the first layer metallic interconnect 1 through an interlayer insulating film 5. A plurality of via holes 3 are provided on the second layer metallic interconnect 2, and the third layer metallic interconnect 4 is coupled to the second layer metallic interconnect 2 through the via holes. Each of the metallic interconnects is, for example, composed of an aluminum interconnect.

As such, in the semiconductor device of the present embodiment, the first layer metallic interconnect 1 is disposed under the entire vias that couple the third layer metallic interconnect 4 to the second layer metallic interconnect 2 so as to overlap with the entire vias.

According to the present embodiment, an abnormal etching of a silica residue generated with conventional structure and caused in a region including cluster of vias, which forms a large-scale meshed pattern for coupling between the second layer metallic interconnect 2 and the third layer metallic interconnect 4, can be prevented.

The first layer metallic interconnect to be disposed in a geometrical relationship for covering the via group is preferably an independent interconnect, which has a different electrical potential from that of the upper layer.

Figure 2:
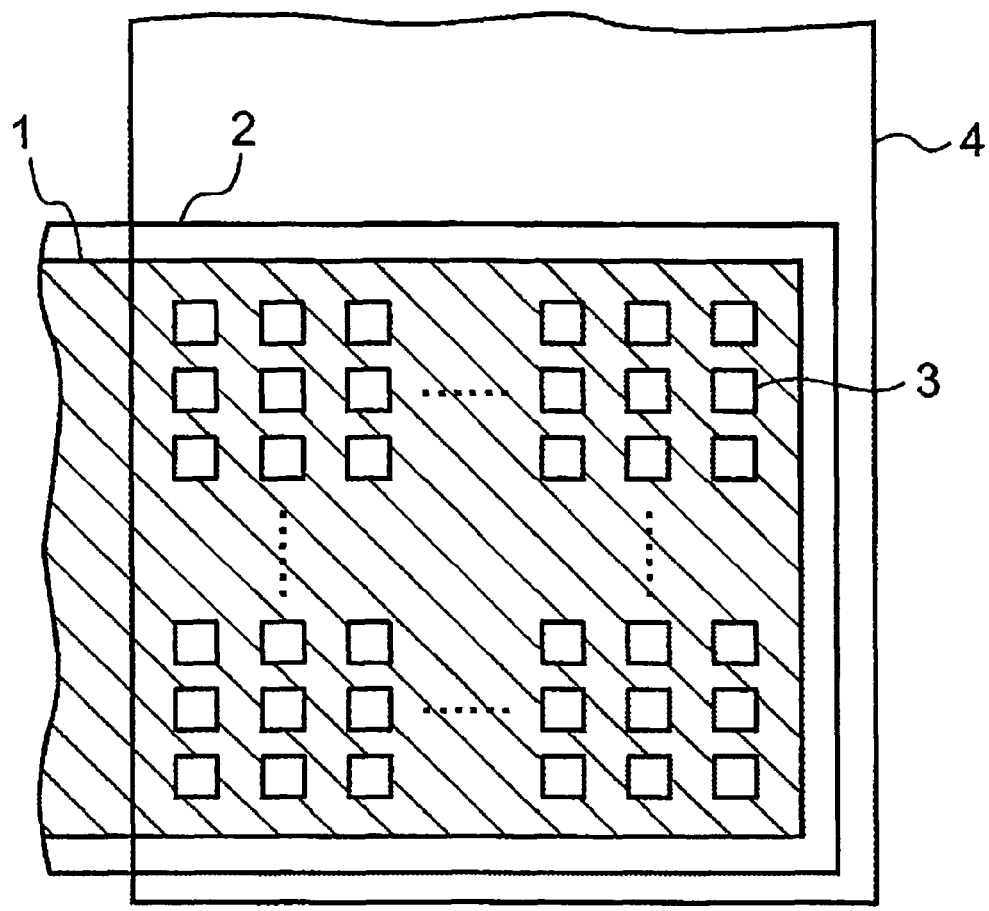
FIG. 2, is a plan view of a semiconductor device of second embodiment according to the present invention.

FIG. 2 is a plan view of a semiconductor device of second embodiment according to the present invention.

In a semiconductor device shown in FIG. 2, the third layer metallic interconnect 4 is provided to elongate in a direction perpendicular to an extending direction of the first layer metallic interconnect 1 and to an extending direction of the second layer metallic interconnect 2.

Figure 3A:
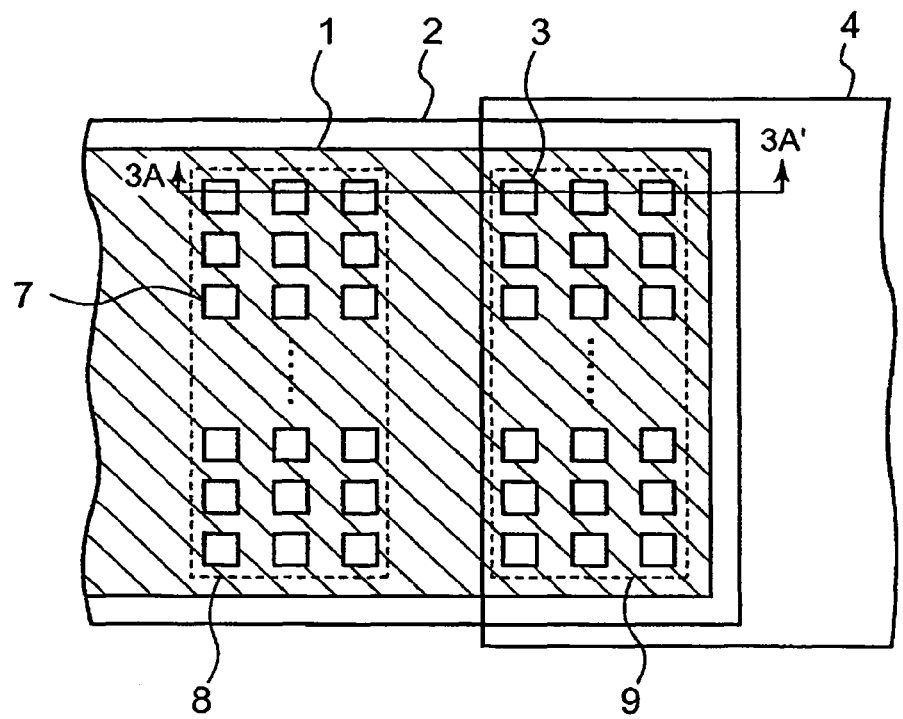
FIG. 3A is a plan view of a semiconductor device of third embodiment according to the present invention.
Figure 3B:
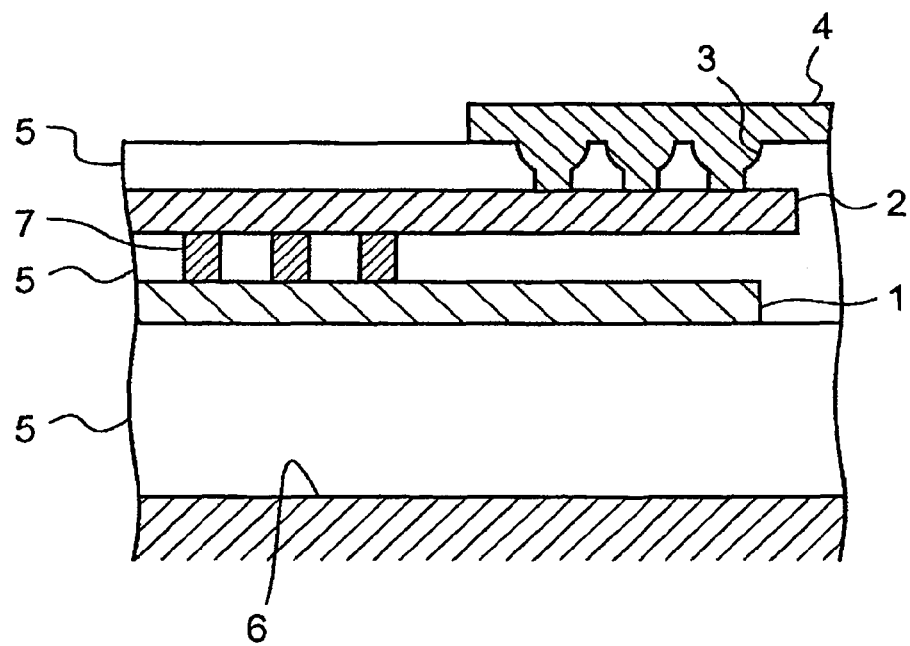
FIG. 3B is a cross-sectional view along line 3A-3A' appeared in FIG. 3A.

FIG. 3A is a plan view of a semiconductor device of third embodiment according to the present invention, and FIG. 3B is a cross-sectional view along line 3A-3A' appeared in FIG. 3A.

The first layer metallic interconnect 1 is provided on a semiconductor substrate 6 through the insulating film 5, and the second layer metallic interconnect 2 is provided on the first layer metallic interconnect 1 through the interlayer insulating film 5. A plurality of via holes 7 are provided on the first layer metallic interconnect 1, and the second layer metallic interconnect 2 is coupled to the first layer metallic interconnect 1 through the vias in the via group 8. Furthermore, a plurality of via hole 3 are provided on the second layer metallic interconnect 2, and the third layer metallic interconnect 4 is coupled to the second layer metallic interconnect 2 through their vias in the via group 9. Each of the metallic interconnects may be, for example, composed of an aluminum interconnect. Alternatively, the metallic interconnect may be a copper interconnect.

According to the present embodiment, in order to prevent a step created by a presence of an end portion of the first layer metallic interconnect 1 provided under the via group 8 from adversely affecting the nature of the via hole 3 in the upper layer, when the via group 8 and the via group 9 are provided to be mutually adjacent, the end portion of the first layer metallic interconnect 1 is extended to cover the entire via group 9.

Figure 4:
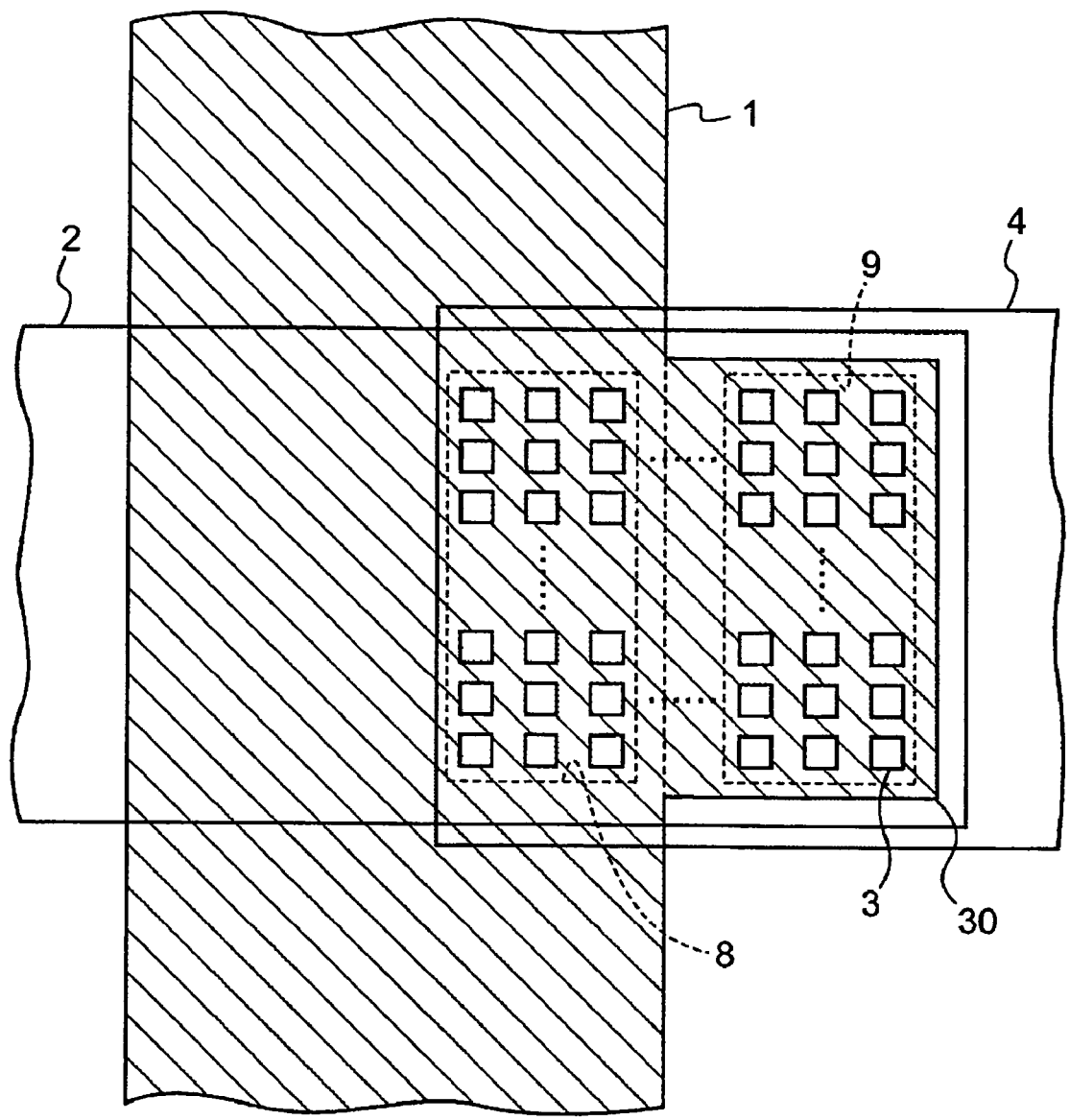
FIG. 4 is a plan view of a semiconductor device of fourth embodiment according to the present invention.
Figure 5:
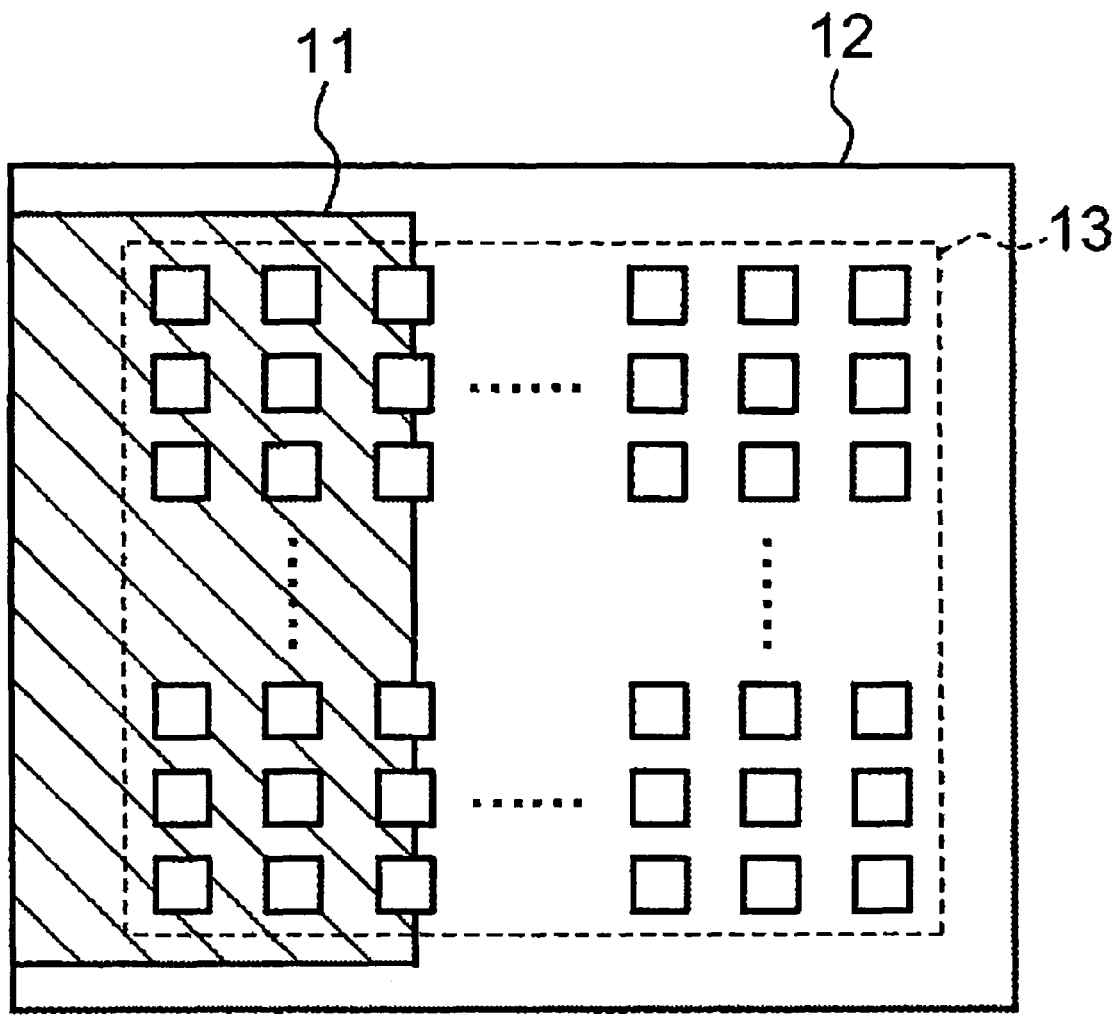
FIG. 5 is a plan view of a conventional semiconductor device.
Figure 6A:
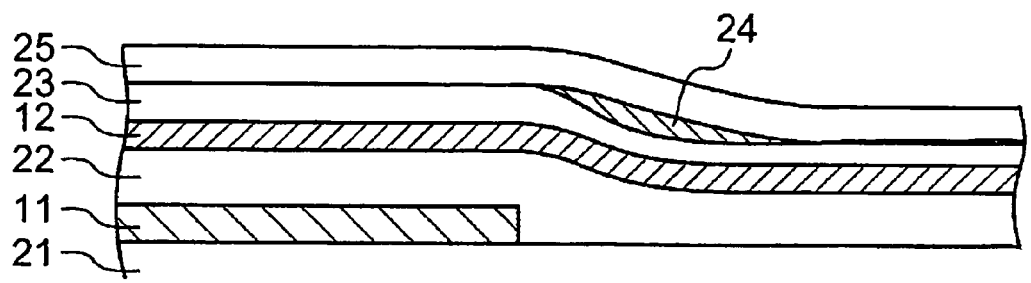
FIGS. 6A and 6B are cross-sectional views of a conventional semiconductor device, useful in describing a process for manufacturing a conventional semiconductor device and problems in the conventional technology.
Figure 6B:
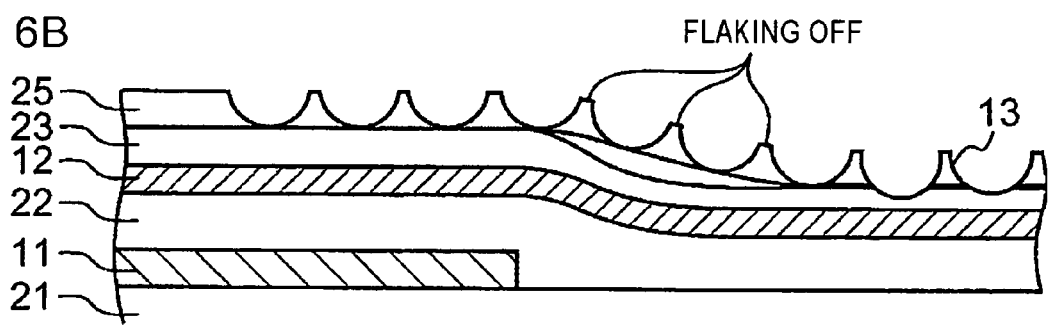

FIG. 4 is a plan view of a semiconductor device of fourth embodiment according to the present invention. A cross-section thereof is basically the same as that of other embodiments, and thus is not repeated here.

As shown in FIG. 4, the second layer metallic interconnect 2 is coupled to the third layer metallic interconnect 4 through the via holes 3 in the via group. The first layer metallic interconnect 1 provided in a layer underlying the second layer metallic interconnect 2 and the third layer metallic interconnect 4 is provided so as to elongate in a direction perpendicular to an extending direction of the second and the third layer metallic interconnects 2 and 4. A protruding portion 30 is formed in the first layer metallic interconnect 1 so as to overlap with all vias included in the via group. Each of the metallic interconnect is for the use in, for example, a power supply interconnect. For example, a power supply potential is supplied to the first layer metallic interconnect 1, and a ground potential is supplied to the second layer metallic interconnect 2 and the third layer metallic interconnect 4.

More specifically, in the semiconductor device of the present embodiment, the first layer metallic interconnect 1 elongates in a first direction so as to overlap with the via group 8, and the second layer metallic interconnect 2 and the third layer metallic interconnect 4 elongate in a second direction that is perpendicular to the first direction, and further, the protruding portion 30 protruded in the second direction from the first layer metallic interconnect 1 is provided so as to overlap with the via group 9, which couples the second layer metallic interconnect 2 to the third layer metallic interconnect 4.

In the present embodiment, the first layer metallic interconnect 1 is also provided to cover the entire via group, so that an abnormal etching of a silica residue can be prevented.

The semiconductor device of the present embodiment may be designed by employing a tool such as computer aided design (CAD), as described below.

A CAD tool involves comparing a positional relationship between the first layer metallic interconnect and the via group, when a design for a semiconductor device including the first layer metallic interconnect, the second layer metallic interconnect, the third layer metallic interconnect and a group of vias that provide an electrical coupling between the second layer metallic interconnect and the third layer metallic interconnect is to be conducted. When the tool judges as a result of the comparison that the first layer metallic interconnect overlaps with some of vias in the via group, the tool provides a design of the semiconductor device that a protruding portion is provided from the first layer metallic interconnect so that the protruding portion overlaps with all vias in the via group.

It is intended that the present invention is not limited to the above-described embodiments, and it is obvious that respective embodiments can be appropriately changed without departing from the scope and spirit of the present invention. In addition, the semiconductor device of the present embodiment can be generally manufactured by one of processes, which are described in the descriptions of the background.

It is apparent that the present invention is not limited to the above embodiment, and may be modified and changed without departing from the scope and spirit of the invention.

What is claimed is:

1. A semiconductor device, comprising:
a first metallic interconnect;
a second metallic interconnect provided on said first metallic interconnect;
a third metallic interconnect provided on said second metallic interconnect; and
a plurality of vias for coupling said second metallic interconnect to said third metallic interconnect,
wherein said first metallic interconnect is provided so as to overlap with all of said plurality of vias;
wherein said first metallic interconnect extends in a first direction so as to overlap with some of said plurality of vias, said second metallic interconnect and said third metallic interconnect extend in a second direction that is perpendicular to said first direction, wherein the first metallic interconnect has a protruding portion that protrudes from said first metallic interconnect toward said second direction, and the rest of said plurality of vias overlap with the protruding portion.

2. The semiconductor device according to claim 1, wherein a first power supply potential is supplied to said first metallic interconnect, and a power supply potential, which is different from said first power supply potential, is supplied to said second metallic interconnect.

3. The semiconductor device of claim 1, further comprising a planarized interlayer insulating film sandwiched between the second and third metallic interconnects in which the plurality of vias are formed, the planarized interlayer insulating film comprising a plasma oxide film coated with silica.

4. A semiconductor device, comprising:
a first metallic interconnect;
a second metallic interconnect provided on said first metallic interconnect;
a third metallic interconnect provided on said second metallic interconnect; and
a plurality of vias for coupling said second metallic interconnect to said third metallic interconnect,
wherein said first metallic interconnect comprises a functional portion and an extension portion, wherein the functional portion is a portion sufficient to carry out the interconnect function of the first metallic interconnect and the extension portion extends from and perpendicular to the functional portion so as to overlap with at least some of said plurality of vias, such that the functional and extension portions of the first metallic interconnect overlap all of the plurality of vias.

5. The semiconductor device of claim 4, further comprising a planarized interlayer insulating film sandwiched between the second and third metallic interconnects in which the plurality of vias are formed, the planarized interlayer insulating film comprising a plasma oxide film coated with silica.

* * * * *